(12) United States Patent
Shizukuishi

(10) Patent No.: US 6,734,031 B2
(45) Date of Patent: May 11, 2004

(54) SOLID-STATE IMAGING DEVICE AND MANUFACTURING METHOD FOR SOLID-STATE IMAGING DEVICE

(75) Inventor: Makoto Shizukuishi, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/434,109

(22) Filed: May 9, 2003

(65) Prior Publication Data
US 2003/0215967 A1 Nov. 20, 2003

(30) Foreign Application Priority Data
May 16, 2002 (JP) ........................................ 2002-141153

(51) Int. Cl.[7] .............................................. H01L 21/00
(52) U.S. Cl. .......................... 438/22; 438/328; 438/979
(58) Field of Search .............................. 438/22, 23, 28, 438/328, 912, 979

(56) References Cited

U.S. PATENT DOCUMENTS 6,407,415 B2 * 6/2002 Lee .............................. 257/215

FOREIGN PATENT DOCUMENTS

| JP | Hei9-045885 | 2/1997 |
| JP | Hei9-116914 | 5/1997 |
| JP | Hei11-284158 | 10/1999 |

* cited by examiner

Primary Examiner—Phuc T. Dang
(74) Attorney, Agent, or Firm—Arent Fox PLLC

(57) ABSTRACT

A solid-state imaging device, comprises: a semi-conductor substrate demarcating a two-dimensional surface; a multiplicity of photoelectric conversion units formed being arranged in a plurality of rows and columns on the semiconductor substrate; a planarizing insulating film formed above the semiconductor substrate; and a plurality of gap-less microlenses having spectral characters, each gap-less microlens being formed above each of the photoelectric conversion units with the planarizing insulating film placed in-between.

21 Claims, 10 Drawing Sheets

(×7500)

(×7500)

US 6,734,031 B2

SOLID-STATE IMAGING DEVICE AND MANUFACTURING METHOD FOR SOLID-STATE IMAGING DEVICE

CROSS REFERENCE TO RELATED APPLICATION

This application is based on Japanese Patent Application 2002-141153, filed on May 16, 2002, the entire contents of which are incorporated herein by reference.

BACKGROUND OF THE INVENTION

A) Field of the Invention

This invention relates to a solid-state imaging device having on-chip microlenses.

B) Description of the Related Art

FIG. 10 are enlarged cross-sectional views showing a part of a conventional solid-state imaging device.

On a surface of a semi-conductor substrate 1 made of n-type silicon or the like, p-type wells are formed. On a surface region of each p-type well, an n-type region 2 and an n-type transfer channel region 3 forming a photoelectric conversion unit (a photodiode) of a p-n junction diode structure. A separating (channel stop) region 4 electrically separating the n-type region 2 and the n-type transfer channel region 3 of the photodiode is formed of a p-type region. The surface of the semi-conductor substrate 1 on which the photodiodes 2, the transfer channel region 3 and the separating region 4 are formed are oxidized to form an insulating film 5 made of a silicon oxide film or the like.

Next, above each transfer channel region 3, a transfer electrode 6 made of double-layer poly-silicon (double poly-silicon) are formed and covered with an insulating film 5a. On the insulating film 5a, a light shading film 7 made of tungsten (W) or the like and having an opening above each of the photodiodes 2 are formed.

On the light shading film 7, a first planarizing layer 8 including a passivation layer and a planarizing insulating layer is formed. On the first planarizing layer 8, a color filter layer 9 consisted of filters of three colors: red (R), green (G) and blue (B). On the color filter layer 9, a second planarizing layer 10 that is transparent insulator such as a photoresist or the like is formed by spin-coat or the like in order to planarize the surface.

On the second planarizing layer 10, a resist layer is formed and are patterned to make microlens patterns 11a by photolithography or the like.

As shown in FIG. 10B, microlenses 11 are formed by flowing the microlens patterns 11a.

All of the above-described microlenses 11 are formed at once under the same condition in order to make their forms equal. Therefore, giving different characteristics to individual microlenses 11 is not performed.

Recently, by miniaturization of a pixel, a radius of the microlens 11 becomes smaller and a focal distance of the microlens 11 becomes shorter as a result; therefore, a focal point will be between the microlens 11 and the surface of the photodiode 2. Therefore, it is necessary to make a distance between the microlens 11 and the surface of the photodiode 2 shorter. In order to make it, it is desired to thin either one of the first planarizing layer 8, the color filter layer 9 and the second planarizing layer 10 formed between the microlens 11 and the surface of the photodiode 2.

The color filter layer 9 cannot be thinned because of necessity of keeping spectral characteristics. That is, if the color filter layer 9 is thinned, color reproductivity is lowered due to mixture of light of wavelength which should not be go through the color filter layer 9. In other words, a color that is not a color of the filter will be mixed in the color of the filter.

If the first planarizing layer 9 formed under the color filter layer 9 is thinned, it is difficult to eliminate steps. Moreover, when the color filter layer 9 is made of a pigment dispersed type colored resist, the color filter layer 9 will be closer to the surface of the photodiode 2 because of the thinning of the first planarizing layer 9. Therefore, grain radius of the pigment will be optical shadows (spots). By the shadows, sensitivity gaps are generated in the photodiode 2 and an image by the photodiode 2 will have grittiness.

The color filter layer 9 is formed colors by colors. That is, the color filter layer 9 is made of a three-color, for example red (R), green (G) and blue (B), mosaic patterned color filter formed by repeatedly patterning on the same plan. At this time, it is difficult to avoid gaps generated by overlapping of the filters at boundaries of each color filter. In order to eliminate the gaps, the second planarizing layer 10 should be formed over the color filter layer 9. It can be considered that the second planarizing layer 10 is omitted to shorten the distance between the microlens 11 and the surface of the photodiode 2. However, if the second planarizing layer 10 is omitted, formation of a high quality microlens will be difficult because the gaps are not eliminated.

SUMMARY OF THE INVENTION

It is an object of the present invention to provide a solid-state imaging device having good spectral sensitivity when a pixel is miniaturized.

Also, it is another object of the present invention to provide a solid-state imaging device having ideal color reproductivity with keeping high sensitivity.

According to one aspect of the present invention, there is provided a solid-state imaging device, comprising: a semiconductor substrate demarcating a two-dimensional surface; a multiplicity of photoelectric conversion units formed being arranged in a plurality of rows and columns on the semiconductor substrate; a planarizing insulating film formed above the semiconductor substrate; and a plurality of gap-less microlenses having spectral characters, each gap-less microlens being formed above each of the photoelectric conversion units with the planarizing insulating film placed in-between.

According to another aspect of the present invention, there is provided a solid-state imaging device, comprising: a semi-conductor substrate demarcating a two-dimensional surface; a multiplicity of photoelectric conversion units formed being arranged in a plurality of rows and columns on the semiconductor substrate; a planarizing insulating film formed above the semiconductor substrate; a plurality of inner-lenses having spectral characters, each inner-lens corresponding to each of the photoelectric conversion units; and a plurality of gap-less microlenses made of a transparent resist, each gap-less microlens being formed above each of the photoelectric conversion units with the planarizing insulating film and the inner lenses placed in-between.

According to further aspect of the present invention, there is provided a manufacturing method of a solid-state imaging device, comprising the steps of: (a) preparing a semiconductor substrate demarcating a two-dimensional surface; (b) forming a multiplicity of photoelectric conversion units arranged in a plurality of rows and columns on the semiconductor substrate; (c) forming a planarizing insulating film above the semiconductor substrate; and (d) forming a plurality of gap-less microlenses having spectral characters, each gap-less microlens being formed above each of the photoelectric conversion units with the planarizing insulating film placed in-between.

According to the present invention, a solid-state imaging device having good spectral sensitivity when a pixel is miniaturized can be provided.

DETAILED DESCRIPTION OF THE PREFERRED EMBODIMENTS

FIG. 1 are plan views schematically showing an arrangement of microlenses of a solid-state device according to a first embodiment of the present invention.

Figure 1A:
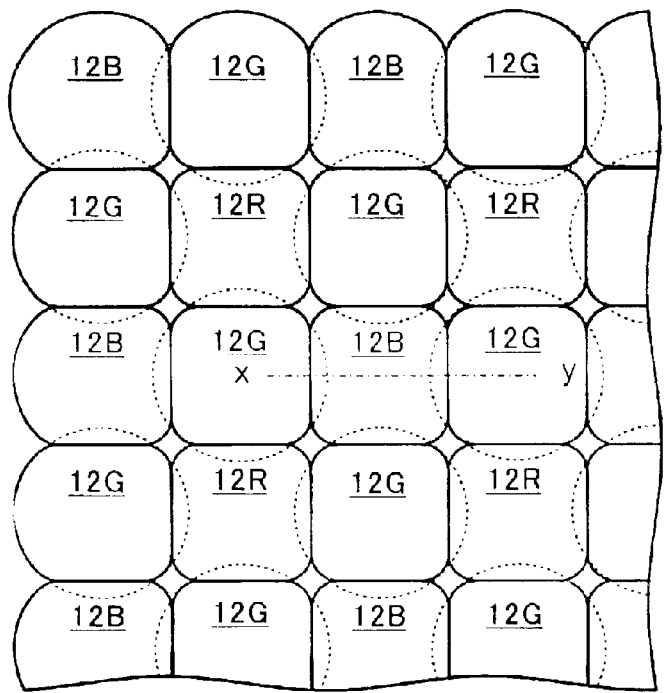
FIG. 1 are plan views schematically showing an arrangement of microlenses of a solid-state device according to a first embodiment of the present invention.

FIG. 1A shows an example of an arrangement of microlenses configured on a surface of substrate in which a plurality of pixels (photoelectric conversion units or photodiodes 2) are tetragonally aligned in a plurality of rows and columns. Each of the microlenses is configured above each of the photodiodes 2.

In a microlens array according to the present invention, except microlenses on the first and last rows and columns, a shape in a plan view of each microlens 12 will be a square with four rounded angles. Each microlens 12 has linear contacts with the microlenses on the next and previous rows and columns at each side of the rounded square in a plan view. Also, the microlenses on the first and last rows and columns have linear contacts with the microlenses on the next or previous rows and columns in a plan view.

A space (invalid area) is formed between the diagonally adjoining microlenses 12. By forming the adjoining microlenses 12 having the contacts with each another as described above, an area size of each microlens 12 in a plan view becomes large. Therefore, a microlens array with small invalid areas can be obtained easily.

Microlenses 12R have a spectral character of red color, microlenses 12G have a spectral character of green color, and microlenses 12B have a spectral character of blue color. In this embodiment, as shown in the drawing, the microlenses 12G having a spectral character of green color are arranged in a check pattern, and the microlenses 12R and 12B are arranged in remaining areas on every other columns.

Further, in this specification, the microlenses 12 or microlens 12 refer(s) to all or one of the microlenses 12R, 12G and 12B.

Figure 1B:
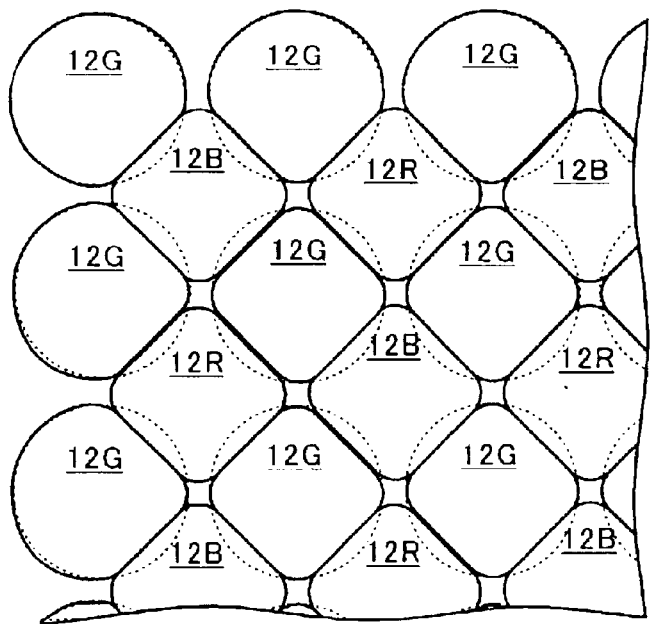

FIG. 1B shows an example of arrangement of a plurality of pixels (photodiodes 2) in the so-called "Pixel Interleaved Array (PIA)".

In this specification, the "Pixel Interleaved Array" is an arrangement wherein a first grid of a two-dimensional tetragonal matrix is mixed with a second grid having grid points at the center of the first grid. For example, each of the photodiodes 2 on even number of columns (rows) is shifted at about ½ of a pitch of the photodiodes 2 in a direction of the column (row) toward the direction of the column (row) in regard to each of the photodiodes 2 on odd number of columns (rows). Also, each of photodiodes columns (rows) includes only the photodiodes 2 on either one of the odd number of column (row) and the even number of column (row). The "Pixel Interleaved Array" is a form of a pixel arrangement wherein multiplicities of photodiodes are arranged in a matrix of a plurality of rows and columns.

Further, the term "about ½" of the pitch includes ½ and, in addition to that, a value that is substantially the same as ½ from a view point of a performance and a quality of picture of a manufactured solid-state imaging device although it is not exactly ½ because of manufacturing error, rounding error of a pixel position occurred by the architecture or masking process, etc. Also, the same concept can be applied to the above-described "about ½ pitch of the photodiodes 2 on the photodiodes row."

Also in a case shown in FIG. 1B, as same as that in FIG. 1A, microlenses 12R have a spectral character of red color, microlenses 12G have a spectral character of green color, and microlenses 12B have a spectral character of blue color. As shown in the drawing, the microlenses 12R, 12G and 12B having spectral characters are arranged as similar to those rotated the arrangement shown in FIG. 1A by 45 degree. Here, although the microlenses 12G of green color are arranged in a tetragonal matrix, it is possible to consider that the microlenses 12G of green color are arranged in a check pattern by viewing from a direction rotated by 45 degree. In this specification, the arrangement like that also id called "a check pattern."

Figure 2A:
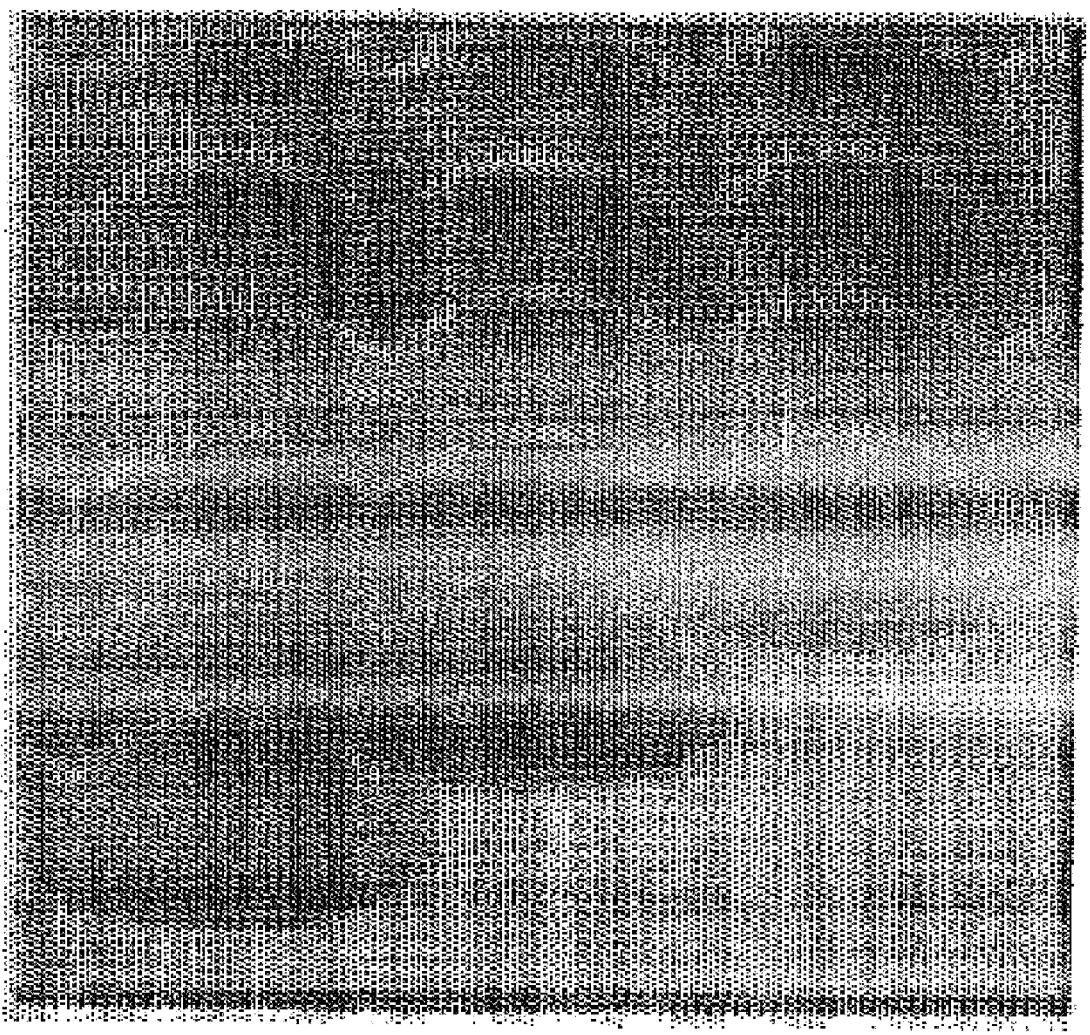
FIG. 2 are photographs showing forms of microlenses 12 according to the embodiment taken by a scanning electron microscope.

FIG. 2A is a photograph showing a perspective view of forms of microlenses 12 according to the embodiment taken by a scanning electron microscope.

As it is obvious from FIG. 2A, in this embodiment, each microlens 12 has a spherical lens shape or a surface shape of being considered as approximately a spherical lens.

Figure 2B:
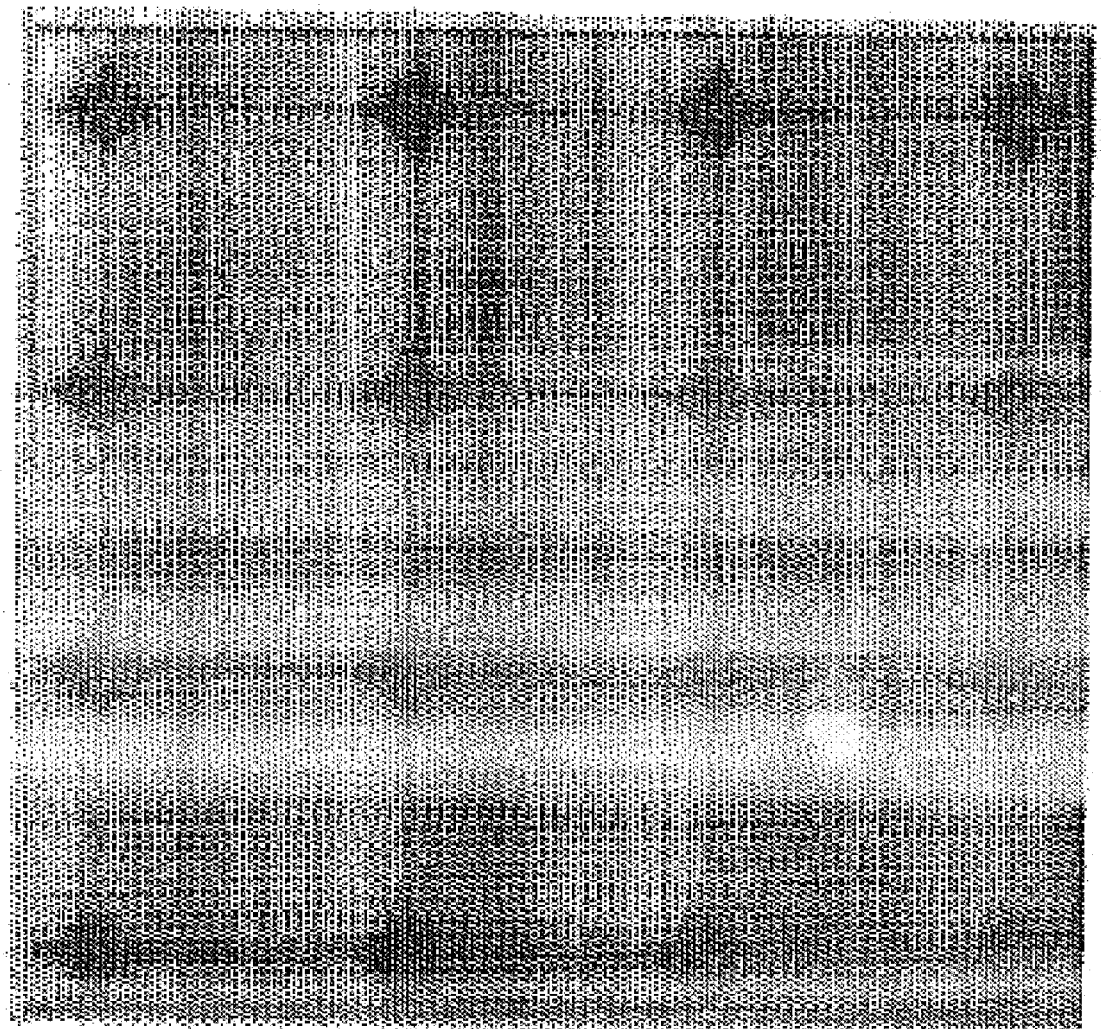

FIG. 2B is a photograph taken by a scanning electron microscope and showing a plan view of the microlenses 12 shown in FIG. 2A. Both photographs are taken by a magnification of 7,500.

As shown in FIG. 2B and also shown in FIG. 2A, each microlens 12 according to this embodiment, except microlenses 12 on the first and last rows and columns, forms a square with four rounded angles. In this specification, the microlenses 12 in that shape and the microlens array consisted of the plurality of the microlenses 12 are called "gap-less microlenses" because they have no gaps between adjoining microlenses.

Further, a manufacturing method of the above-described gap-less microlenses is disclosed in a section of the preferred embodiments in Japanese Patent Application No. 2002-025519 filed by the same applicant as the present invention. For example, a lens pattern corresponding to the microlenses 12G shown in FIG. 1A is formed with resist patterns having surface shapes (broken line parts) of a circle or a polygon, and the microlenses 12G are formed by melting the resist patterns.

Thereafter, the red microlenses 12R and the blue microlenses 12B having rectangle surface shapes are formed in sequence. Parts of bases (broken line parts) of the green microlenses 12 are covered by the parts of the red and blue microlenses 12R and 12B.

Figure 3:
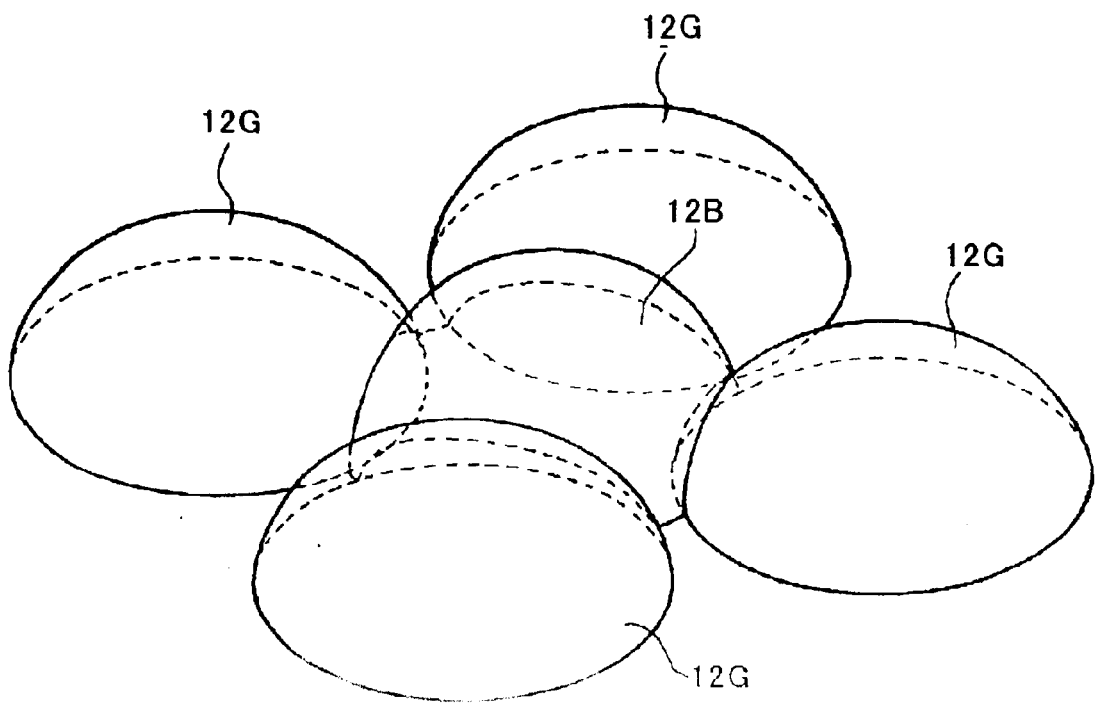
FIG. 3 is a perspective view for explaining a principle from which a microlens according to the first embodiment of the present invention turns into the microlens 12 of spherical lens form or mostly spherical lens form.

FIG. 3 is a perspective view for explaining a principle from which the microlens according to the first embodiment of the present invention turns into the microlens 12 of spherical lens shape or mostly spherical lens shape. FIG. 3 shows a situation when blue microlens patterns 12Ba are re-flowed to cover the parts of four green microlenses 12G. In the drawing, the re-flowed microlens patterns are indicated by the reference symbol 12Ba.

Shapes in a plan view of the blue microlens pattern 12Ba before they are re-flowed are rectangles or squares.

By forming the pattern having a plan shape of a rectangle or a square on a plane and re-flowing it, a curvature of the surface will be an aspheric lens. A surface connecting middle points of opposing sides becomes an arc having a first radius by surface tension. At this time, heights of the surface connecting opposing angles are same and base lines of that become long. If this surface becomes an arc, its radius will be larger than the first radius. Therefore, a surface obtained as a result is not a spherical.

The reason for that is conjectured that a shape (rectangle or square) of contacting surface of the plane and the pattern is not changed although a force to become a semi-spherical shape works by the surface tension at the time of the re-flowing.

By forming a circle shaped pattern on a plane and re-flowing it, the above-described situation will be cancelled, and a spherical shape can be obtained. The green microlenses 12G have spherical shapes obtained by that. Here, the rectangle areas shown in FIG. 1A and FIG. 1B will be considered. Each side contacts with a base surface at both ends, and intermediate part of each side are gradually rising. When the surrounding edge like that can be realized, a spherical shape can be obtained inside the inner area of the surrounding edge.

The blue microlens patterns 12Ba is formed to partially overlap with the green microlens 12G. By considering the lower surrounding edge of each of the blue microlens patterns 12Ba, both ends of each side of the pattern contact with the base surface as described in the above, and the intermediates of the sides are risen by the adjoining microlenses 12G.

Therefore, a surface shape of each re-flowed blue microlens pattern 12Ba will stably be a spherical shape or a shape regarded as an approximately a spherical shape. It is important that the spherical lenses formed at first are regularly and precisely configured and rectangle patterns formed thereafter are configured precisely toward the previously formed spherical lenses.

Therefore, by cooling the re-flowed blue microlens patterns 12Ba, the blue microlenses 12B, each having a spherical shape or a shape regarded as an approximately a spherical shape, can be obtained.

For conventional microlenses, it is necessary to form gaps in order to prevent sticking of the microlenses by melting. The gaps prevent efficient use of irradiating light, and therefore, sensitivity is decreased. However, by forming the gap-less microlenses by the above-described method, the decrease of the sensitivity can be prevented.

The above-described manufacturing method of the gap-less microlenses uses so-called re-flow method in which a surface is formed by melting; therefore, flatness of the surface can also be improved.

FIG. 4 are enlarged cross sectional views showing a solid-state imaging device according to the first embodiment cut along with a line x-y in FIG. 1. Further, the same reference numbers as in FIG. 10 indicate substantially the similar parts.

On a surface of a semi-conductor substrate 1 made of n-type silicon or the like, p-type wells are formed. On a surface region of each p-type well, an n-type region 2 (hereinafter called a photodiode 2 for convenience of the explanation) and an n-type transfer channel region 3 forming a photoelectric conversion unit (a photodiode) of a p-n junction diode structure. A separating (channel stop) region 4 electrically separating the photodiode 2 and the n-type transfer channel region 3 is formed of a p-type region. The surface of the semi-conductor substrate 1 on which the photodiodes 2, the transfer channel region 3 and the separating region 4 are formed are thermal oxidized to form an insulating film 5 made of a silicon oxide film or the like.

Next, above each transfer channel region 3, a transfer electrode 6 made of double-layer poly-silicon (double poly-silicon) are formed and covered with an insulating film 5a. On the insulating film 5a, a light shading film 7 made of tungsten (W) or the like and having an opening above each of the photodiodes 2 are formed. On the light shading film 7, a planarizing layer 8 including a passivation layer and a planarizing insulating layer is formed. The above-described process is one example of well-known technique, and the other well-known technique can be applied to the above-described process.

Next, a forming process of the microlenses 12 will be explained. Each of the microlenses 12 is formed above each of the photodiodes 2 with one to one correspondence.

Figure 4A:
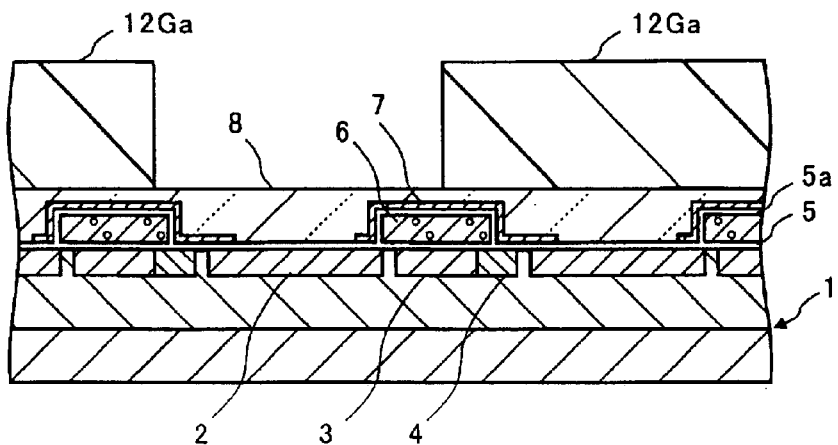
FIG. 4 are enlarged cross sectional views showing a solid-state imaging device according to the first embodiment cut along with a line x-y in FIG. 1.

At first, green color resist that is material of the green microlenses 12G is coated on a surface of the planarizing layer 8 by spin-coat or the like. The green color resist is removed with remaining necessary parts by photolithography or the like, and the green microlens patterns 12Ga are formed by patterning. FIG. 4A shows the solid-state imaging device 1 up to this point.

The green color resist that is material of the green microlenses 12G is selectively patterned to be circles or polygons having eight or more than eight angles for making the surface of the planarizing layer 8 exposing among the green microlens patterns 12Ga adjoining in row and column directions be a check pattern. For example, it is patterned to be circles or approximately circles as shown by the broken lines in FIG. 1A and FIG. 1B.

Thereafter, surfaces of the remaining green microlens patterns 12Ga are re-flowed by heating in order to form lens shapes. Moreover, the microlenses 12G are formed by post-bake for thermoset composition. At this time, each of the blue microlenses 12G has a plan shape of a circle and is a spherical shape or an approximately spherical shape.

Figure 4B:
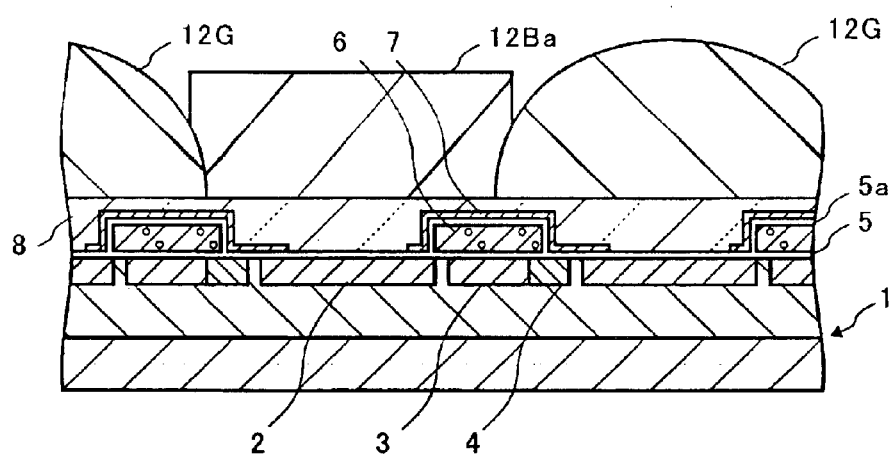

Next, blue color resist is coated on the surface of the planarizing layer 8 on which the microlenses 12G are formed by spin-coat or the likes. The blue color resist is removed with remaining necessary parts by photolithography or the like, and the blue microlens patterns 12Ba are formed by patterning. FIG. 4B shows the solid-state imaging device 1 up to this point.

At this time, each of the blue microlens patterns 12Ba is formed to cover the surface of the planarizing layer 8 exposing among the microlenses 12G adjoining in row and column directions and to partially cover the adjoining green microlenses 12G.

In order to form a microlens having a spherical shape or an approximately spherical shape from each of the blue microlens pattern 12Ba, sizes of each blue microlens pattern 12Ba and its adjoining green microlenses 12G are preferably selected according to the following way for overlapping each blue microlens pattern 12Ba and its adjoining green microlenses 12G. That is, in a plan view showing areas where each blue microlens pattern 12Ba and its adjoining green microlenses 12G are overlapping, the sizes of each blue microlens pattern 12Ba and its adjoining green microlenses 12G are preferably selected wherein more than 50% or preferably more than 60% of one side of the blue microlens pattern 12Ba is positioned over the adjoining green microlenses 12G.

The blue microlens patterns 12Ba are formed in positions, for example, indicated by the reference symbols "12B" shown in FIG. 1A or FIG. 1B. That is, they are formed to cover a half number of the surfaces of the planarizing layer 8 exposed between the green microlenses 12G adjoining in row and column directions. For example, when the photodiodes 2 are arranged in a tetragonal matrix, the blue microlens patterns 12Ba are formed on every other columns to cover the surfaces of the planarizing layer 8 exposed between the green microlenses 12G adjoining in row and column directions.

Also, for example, when the photodiodes 2 are arranged in a Pixel Interleaved Array, are formed on every other column and every other row to cover the surfaces of the planarizing layer 8 exposed between the green microlenses 12G adjoining in row and column directions.

Figure 4C:
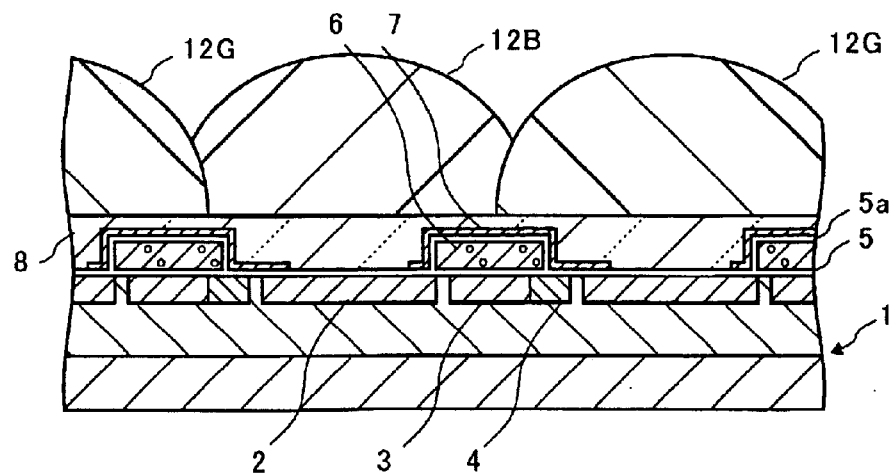

Thereafter, surfaces of the remaining blue microlens patterns 12Ba are re-flowed by heating in order to form lens shapes. Moreover, the blue microlenses 12B are formed by post-bake for thermoset composition. FIG. 4C shows the solid-state imaging device 1 up to this point.

Further, by performing the similar process as the blue microlenses 12B, the microlenses 12R (FIG. 1) are formed on the remaining exposed surfaces of the planarizing layer 8. Moreover, the colors of the microlenses 12 and the order of the formation are not limited to those explained in the above, and, for example, the red microlenses 12R may be formed right after the formation of the green microlenses 12G.

As described in the above, according to this embodiment, the microlenses 12 are formed by three steps; therefore, the microlenses 12 can be formed of color resists of three different colors.

As described in the above, by providing the microlenses 12 the similar function as the conventional color filter layer 9 (FIG. 10), the color filter layer 9 and the planarizing layer 10 formed thereon can be omitted. Therefore, with miniaturizing a solid-state imaging device, a distance between the microlenses 12 and the light receiving element can be short.

Moreover, the microlenses 12, comparing to the conventional color filter layer 9, is far from the light receiving element; therefore, the pigment dispersed type colored resist can be easily used as material of the microlenses 12.

Further, although a colored resist for forming the microlenses 12 is preferably the pigment dispersed type colored resist by considering chemical stability, dye type resist can also be used.

Also, in this embodiment, by using the gap-less microlenses, light irradiating to peripheral areas of the microlenses can be efficiently collected to the surfaces of light receiving parts of the photodiodes. Therefore, the light shielding film 7 may be omitted.

Figure 5:
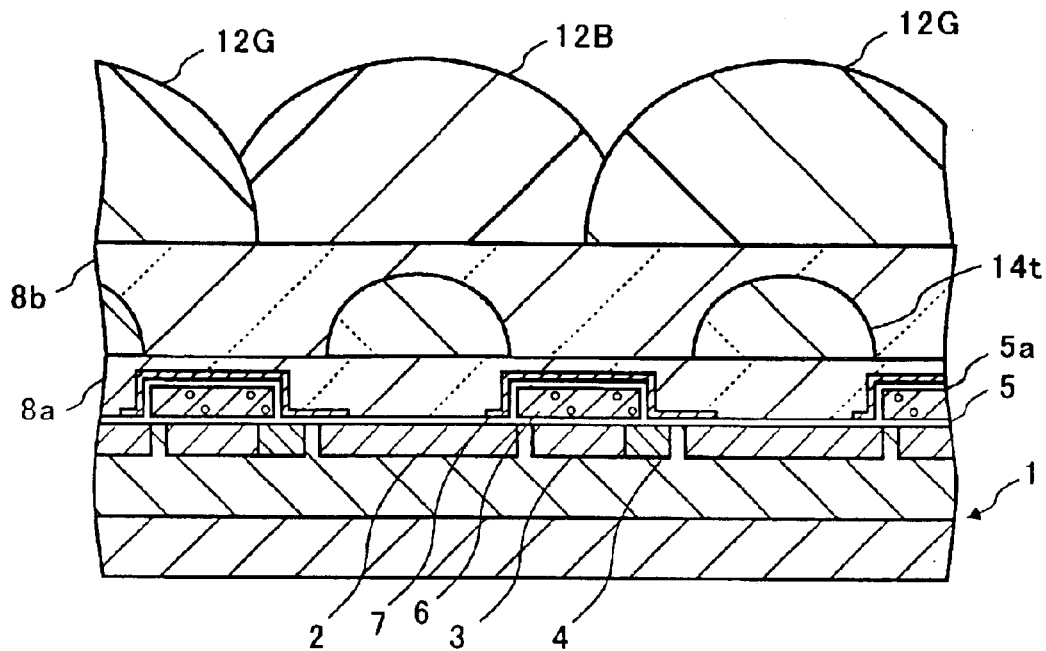
FIG. 5 is an enlarged cross sectional view showing a solid-state imaging device according to a second embodiment of the present invention.

FIG. 5 is an enlarged cross sectional view showing a solid-state imaging device according to a second embodiment of the present invention. Further, the same reference numbers as in FIG. 10 and FIG. 4 indicate substantially the similar parts.

On a surface of a semi-conductor substrate 1 made of n-type silicon or the like, p-type wells are formed. On a surface region of each p-type well, an n-type region 2 (hereinafter called a photodiode 2 for convenience of the explanation) and an n-type transfer channel region 3 forming a photodiode of a p-n junction diode structure. A separating (channel stop) region 4 electrically separating the photodiode 2 and the n-type transfer channel region 3 is formed of a p-type region. The surface of the semi-conductor substrate 1 on which the photodiodes 2, the transfer channel region 3 and the separating region 4 are formed are thermal oxidized to form an insulating film 5 made of a silicon oxide film or the like.

Next, above each transfer channel region 3, a transfer electrode 6 made of double-layer poly-silicon (double poly-silicon) are formed and covered with an insulating film 5a. On the insulating film 5a, a light shading film 7 made of tungsten (W) or the like and having an opening above each of the photodiodes 2 are formed. On the light shading film 7, a first planarizing layer 8a including a passivation layer and a planarizing insulating layer is formed. The above-described process is one example of well-known technique, and the other well-known technique can be applied to the above-described process. Further, the light shading film 7 can be omitted as same as the first embodiment.

Next, transparent resin is coated on the first planarizing layer 8a by spin-coat or the likes. The transparent resin is removed with remaining necessary parts by photolithography or the like, and inner-lens patterns are formed by patterning. Thereafter, surfaces of the remaining inner-lens patterns are post-baked for thermoset composition to form transparent inner-lens 14t.

Next, covering the formed inner-lens 14t and the exposed surface of the first planarizing layer 8a, a second planarizing layer 8b is formed.

On the upper surface of the second planarizing layer 8b, the microlenses 12R, 12G and 12B of three colors, R(red), G(green) and B(blue) are formed by the similar process as in the above-described first embodiment.

Figure 6:
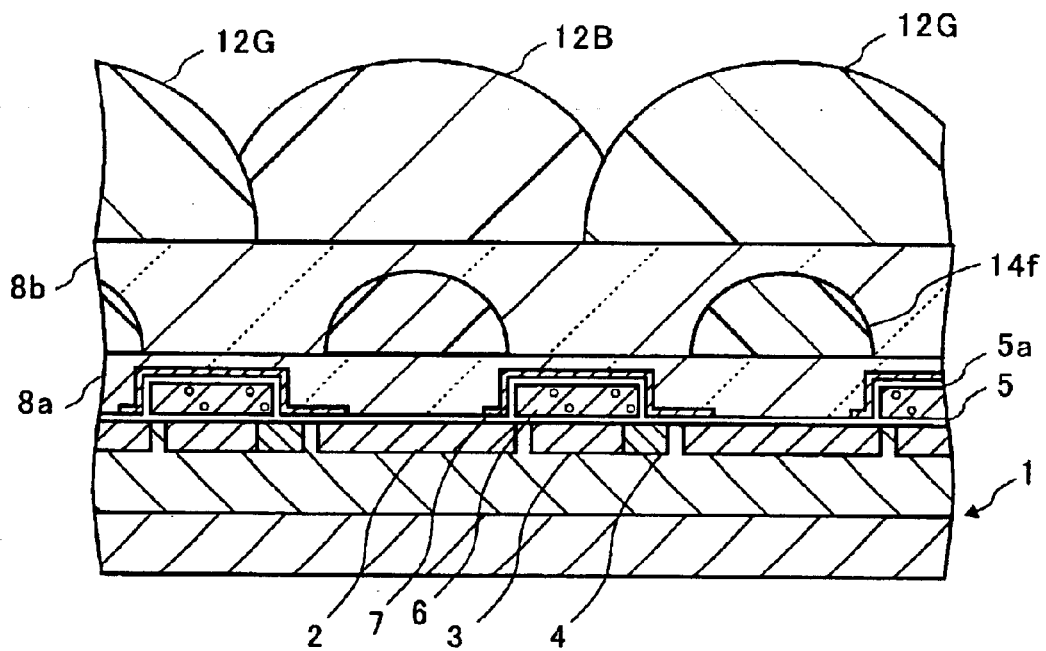
FIG. 6 is an enlarged cross sectional view showing a solid-state imaging device according to a modified example of the second embodiment of the present invention.

FIG. 6 is an enlarged cross sectional view showing a solid-state imaging device according to a modified example of the second embodiment of the present invention.

Figure 10A:
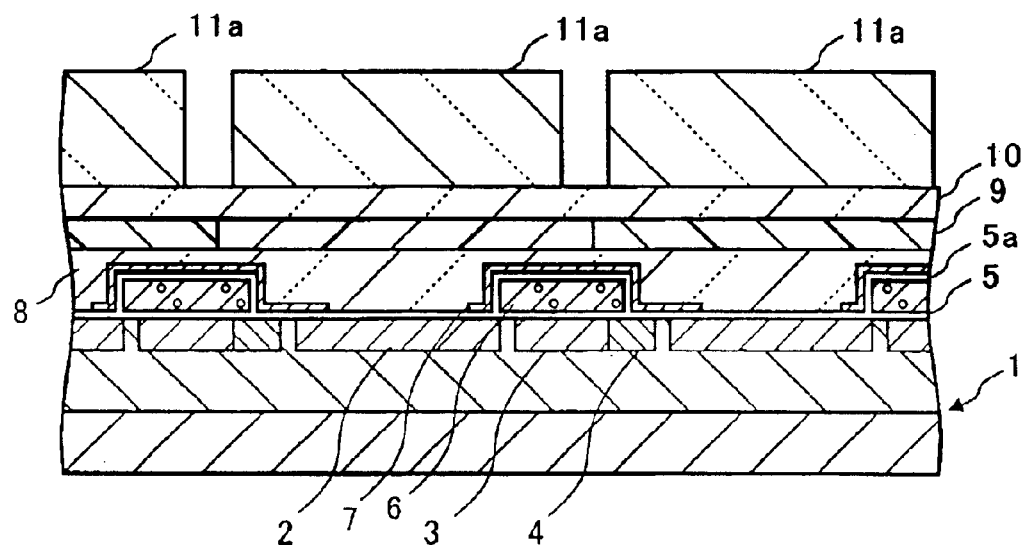
FIG. 10 are enlarged cross-sectional views showing a part of a conventional solid-state imaging device.
Figure 10B:
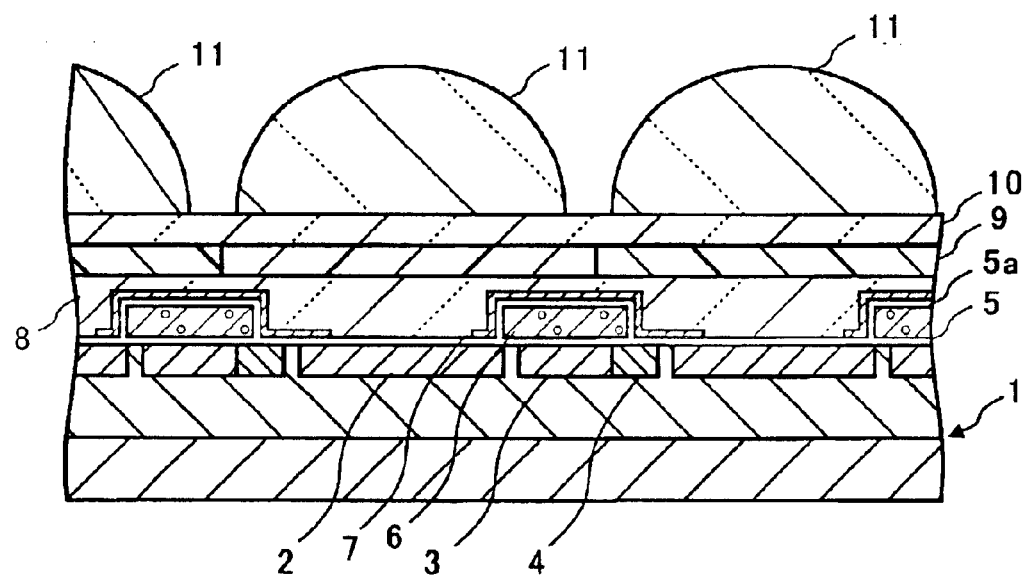

In this modified example of the second embodiment, inner-lenses 14f are formed by using a colored resist. Because the inner-lenses 14f are formed by using a colored resist, the inner-lenses 14f have similar functions as the color filter layer 9 (FIG. 10).

Also, the inner-lenses 14f may be formed as gap-less microlenses formed of a colored resist by the process similar to the first embodiment.

Moreover, the microlenses 12 and the inner-lenses 14f may be formed of either one of the pigment dispersed type and the dye type colored resist.

Preferably, the microlenses 12 far from the light receiving part are made of the pigment dispersed type colored resist, and the inner-lenses 14f close to the light receiving part are made of a dye type colored resist.

By doing that, it is possible to utilize advantages of pigment dispersed type color filter material (a colored resist) having a good tolerance to light and chemical stability without an effect of granularity of pigment, and, at a mean time, it is possible to utilize advantages of dye type color filter material (a colored resist) without a problem of granularity.

Further, when both of the microlenses 12 and the inner-lenses 14f are made of the same main material for color filter, the microlenses 12 and the inner-lenses 14f may have different spectral characters. By doing this, total spectral character that cannot be achieved with one color filter material can be achieved.

As described in the above, in the second embodiment and its modified example, two or more than two types of microlenses (e.g., the microlenses 12 and inner-lenses 14) having color filter function correspond to each one of light receiving parts (e.g., photodiodes 2).

Therefore, loss of spectral characteristics due to miniaturization and thinning of a solid-state imaging device can be improved. Also, it is possible to combine two or more than two types of microlenses having different spectral characters corresponding to one light receiving part; therefore, color filter function having good color reproductivity can be achieved.

Further, when the inner-lenses 14f are made of a colored resist as in the modified example of the second invention, the microlenses 12 may be formed of transparent resin.

Figure 7:
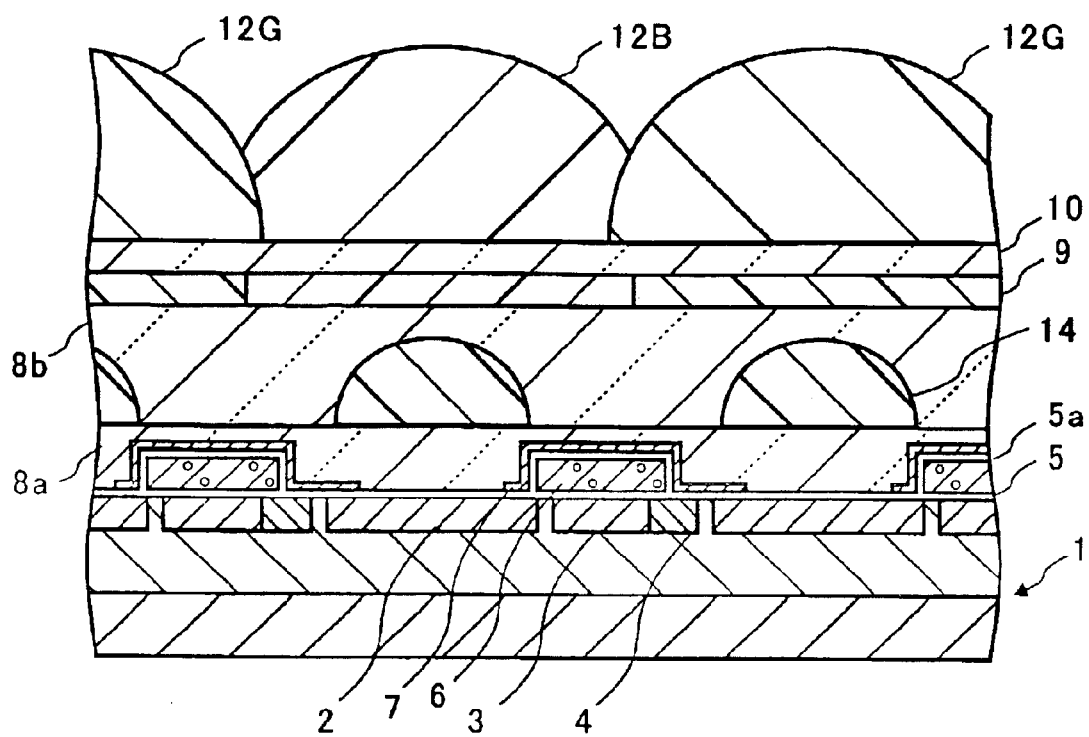
FIG. 7 is an enlarged cross sectional view showing a solid-state imaging device according to a third embodiment of the present invention.

FIG. 7 is an enlarged cross sectional view showing a solid-state imaging device according to a third embodiment of the present invention. Further, the same reference numbers as in FIG. 10, FIG. 4, FIG. 5 and FIG. 6 indicate substantially the similar parts.

On a surface of a semi-conductor substrate 1 made of n-type silicon or the like, p-type wells are formed. On a surface region of each p-type well, an n-type region 2 (hereinafter called a photodiode 2 for convenience of the explanation) and an n-type transfer channel region 3 forming a photodiode of a p-n junction diode structure. A separating (channel stop) region 4 electrically separating the photodiode 2 and the n-type transfer channel region 3 is formed of a p-type region. The surface of the semi-conductor substrate 1 on which the photodiodes 2, the transfer channel region 3 and the separating region 4 are formed are thermal oxidized to form an insulating film 5 made of a silicon oxide film or the like.

Next, above each transfer channel region 3, a transfer electrode 6 made of double-layer poly-silicon (double poly-silicon) are formed and covered with an insulating film 5a. On the insulating film 5a, a light shading film 7 made of tungsten (W) or the like and having an opening above each of the photodiodes 2 are formed. On the light shading film 7, a first planarizing layer 8a including a passivation layer and a planarizing insulating layer is formed. The above-described process is one example of well-known technique, and the other well-known technique can be applied to the above-described process. Further, the light shading film 7 can be omitted as same as the first and the second embodiments.

Next, transparent resin is coated on the first planarizing layer 8a by spin-coat or the likes. The transparent resin is removed with remaining necessary parts by photolithography or the like, and inner-lens patterns are formed by patterning. Thereafter, surfaces of the remaining inner-lens patterns are post-baked for thermoset composition to form transparent inner-lens 14. Further, the inner-lenses 14 may be made of not only transparent resin but also a colored resist. That is, for the inner-lenses 14 according to the third embodiment, either one of the inner-lenses 14t shown in FIG. 5 or the inner-lenses 14f shown in FIG. 6 may be used. Hereinafter, in this specification, the inner-lenses 14 refer to either one of the inner-lenses 14t shown in FIG. 5 or the inner-lenses 14f shown in FIG. 6.

Next, covering the formed inner-lens 14 and the exposed surface of the first planarizing layer 8a, a second planarizing layer 8b is formed. Thereafter, on the upper surface of the second planarizing layer 8b, a color filter layer 9 consisted of filters in three colors: R (red) G (green) and B (blue).

On the color filter layer 9, in order to planarize the surface, a third planarizing layer 10 made of transparent insulator such as a photoresist or the like by spin-coat or the like. The third planarizing layer 10 can be stand during a thermal process taken thereafter.

On an upper surface of the third planarizing layer 10, the microlenses 12R, 12G and 12B of three colors, R(red), G(green) and B(blue) are formed by the similar process as in the above-described first embodiment.

In this third embodiment, the microlenses 12 (and the inner-lenses 14f) have color filter function; therefore, the color filter layer 9 according to this embodiment can be made thinner than that according to the prior art.

Moreover, the microlenses 12, color filter layer 9 and the inner-lenses 14f may be formed of either one of the pigment dispersed type and the dye type colored resist.

Preferably, the microlenses 12 far from the light receiving part are made of the pigment dispersed type colored resist, and the color filter layer 9 and the inner-lenses 14f close to the light receiving part are made of a dye type colored resist.

By doing that, it is possible to utilize advantages of pigment dispersed type color filter material (a colored resist) having a good tolerance to light and chemical stability without an effect of granularity of pigment, and, at a mean time, it is possible to utilize advantages of dye type color filter material (a colored resist) without a problem of granularity.

Further, when the microlenses 12, the color filter layer 9 and the inner-lenses 14f are made of the same main material for color filter, the microlenses 12, the color filter layer 9 and the inner-lenses 14f may have different spectral characters. By doing this, total spectral characters that cannot be achieved with one color filter material can be achieved.

As described in the above, in this third embodiment, two or more than two types of microlenses, for example, the microlenses 12 (or the inner-lenses 14f) and inner-lenses 14 having color filter function correspond to each one of light receiving parts (e.g., photodiodes 2).

Therefore, loss of spectral characters due to miniaturization and thinning of a solid-state imaging device can be improved. Also, it is possible to combine two or more than two types of microlenses having different spectral characters corresponding to one light receiving part; therefore, color filter function having good color reproductivity can be achieved.

Figure 8A:
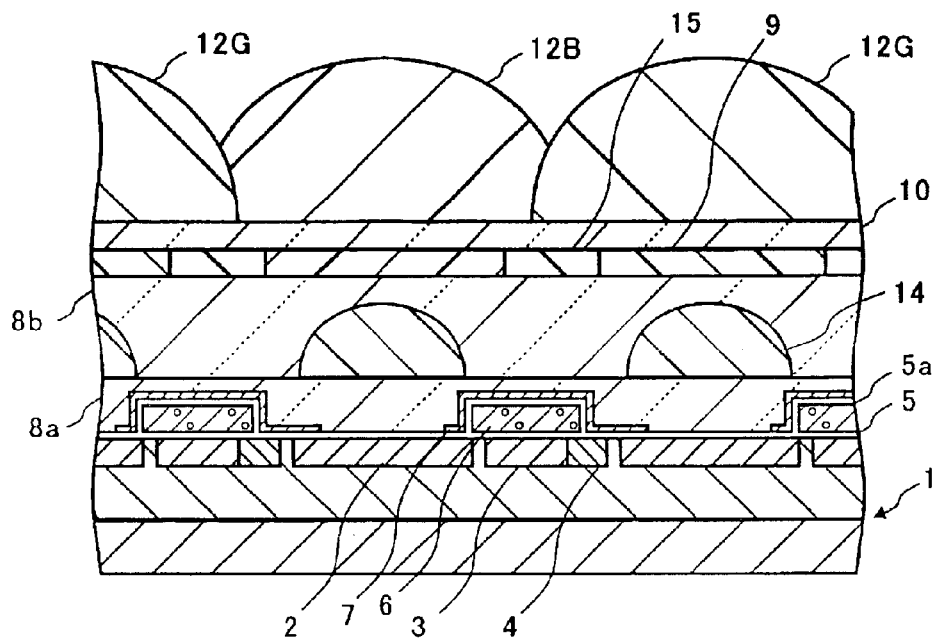
FIG. 8 are enlarged cross sectional views showing a solid-state imaging device according to a fourth embodiment of the present invention.

FIG. 8A is an enlarged cross sectional view showing a solid-state imaging device according to a fourth embodiment of the present invention.

Comparing to the above-described third embodiment, the solid-state imaging device according to this fourth invention includes a light shielding layer 15 (a black matrix) made of a black-colored resist between each color of the color filter layer 9 to eliminate optical interference of color resists by separating each color from others. The light shielding layer 15 is, for example, made of a black-colored resist or the likes that can shield irradiated light.

Although a conventional color filter layer should have a certain thickness for maintaining spectral characters, the color filter layer 9 according to this embodiment can be thinner than the conventional color filter layer because the microlenses 12 (or the inner-lenses 14f) and inner-lenses 14 perform color filter function and because of function of the black matrix. Also, the light shielding film 7 can be omitted. Moreover, opening shapes of the black matrix can be made uniformed, and irradiation of unnecessary light to the light receiving parts can be prevented.

Further, the light shielding layer 15 may be made by coloring with black color after forming a layer made of transparent resin or the likes.

Figure 8B:
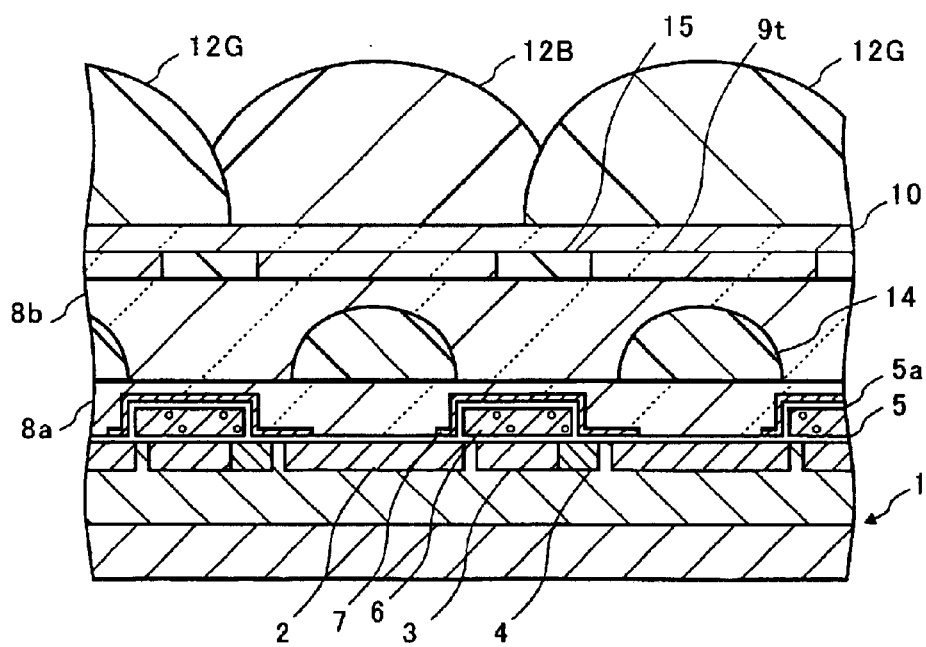

Moreover, as shown in FIG. 8B, a color filter layer 9t may be transparent. In that case, the color filter layer 9t and the third planarizing layer 10 may be formed together as a same layer.

As described in the above, according to the embodiments of the present invention, the gap-less microlenses are formed by so-called re-flow method. Therefore, the planarity of the surfaces of the microlenses are improved and an yield will be improved.

The second planarizing layer 8b and the inner-lens 14 (14f, 14t) are suitably made of different transparent resins having different refractive indexes in an optical architecture.

Also, the first planarizing layer 8a and the second planarizing layer 8b may be suitably made of different transparent resins having different refractive indexes in an optical architecture.

Further, in the embodiments of the present invention, only the spectral characters of the microlenses 12 are differentiated, however, resists that are material of the microlenses 12, radiuses, refractive indexes and heights of the microlenses 12 may be differentiated according to the spectral characters (colors) of the microlenses 12. By doing that, optical sensitivities can be adjusted for pixels group by group according to the colors to which the group of the pixels corresponds.

Moreover, colors of colored resists used for making the microlenses 12 are not limited to primary colors, but also may be complementary colors.

Figure 9:
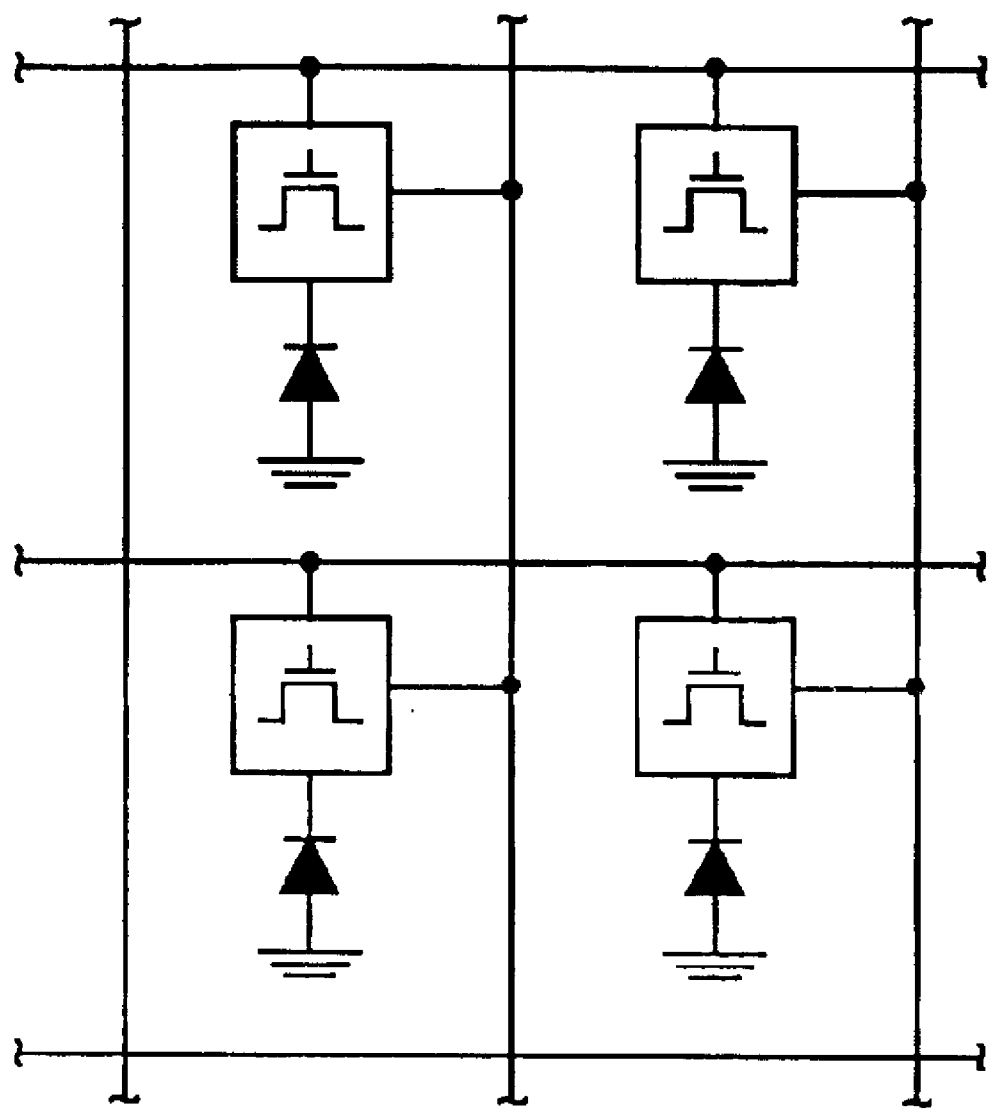
FIG. 9 is a schematic circuit diagram showing an example of a MOS-type solid-state imaging device.

Further, a CCD-type solid-state imaging device has been used for explaining the embodiments of the present invention, the present invention can be applied to a MOS-type solid-state imaging device as shown in FIG. 9. Moreover, the MOS-type solid-state imaging device can be formed by well-known technique.

The present invention has been described in connection with the preferred embodiments. The invention is not limited only to the above embodiments. It is apparent that various modifications, improvements, combinations, and the like can be made by those skilled in the art.

What are claimed are:

1. A solid-state imaging device, comprising:
    a semi-conductor substrate demarcating a two-dimensional surface;
    a multiplicity of photoelectric conversion units formed being arranged in a plurality of rows and columns on the semiconductor substrate;
    a planarizing insulating film formed above the semiconductor substrate; and
    a plurality of gap-less microlenses having spectral characters, each gap-less microlens being formed above each of the photoelectric conversion units with the planarizing insulating film placed in-between.

2. A solid-state imaging device according to claim 1, wherein the gap-less microlenses comprising:
    first group of microlenses, each of the first group of microlenses being formed in correspondence to one of the photoelectric conversion units selected from the multiplicity of photoelectric conversion units;
    second group of microlenses, each of the second group of microlenses being formed to partially cover the adjoining first microlenses, in correspondence to one of a first part of the photoelectric conversion units being not selected for the first group of microlenses; and
    third group of microlenses, each of the third group of microlenses being formed to partially cover the adjoining first microlenses, in correspondence to one of a second part of the photoelectric conversion units being not selected for the first group of microlenses.

3. A solid-state imaging device according to claim 2, wherein each of the first, the second and the third groups of the microlenses has different spectral characters with other groups of the microlenses.

4. A solid-state imaging device according to claim 2, wherein each microlens of the first group is corresponding to one of the photoelectric conversion units selected in a check pattern.

5. A solid-state imaging device according to claim 1, further comprising inner-lenses formed below the planarizing insulating film, each inner-lens corresponding to each one of the multiplicity of photoelectric conversion units.

6. A solid-state imaging device according to claim 5, further comprising a color filter layer formed between the planarizing insulating film and the plurality of the gap-less microlenses.

7. A solid-state imaging device according to claim 6, wherein the color filter layer is formed in a first area corresponding to the photoelectric conversion units, and further comprising
    a black-colored resin layer formed in a second area other than the first area.

8. A solid-state imaging device according to claim 6, wherein the color filter layer is formed of dye type colored resists.

9. A solid-state imaging device according to claim 6, wherein the color filter layer is formed of pigment dispersed type colored resists.

10. A solid-state imaging device according to claim 5, wherein the inner-lenses are formed of dye type colored resists.

11. A solid-state imaging device according to claim 5, wherein the inner-lenses are formed of pigment dispersed type colored resists.

12. A solid-state imaging device according to claim 5, wherein the inner-lenses are formed of a transparent resist.

13. A solid-state imaging device according to claim 6, wherein the plurality of the gap-less microlenses have different spectral characters from the inner-lenses or the color filter layer.

14. A solid-state imaging device according to claim 1, wherein the plurality of the gap-less microlenses are formed of pigment dispersed type colored resists.

15. A solid-state imaging device according to claim 1, wherein the plurality of the gap-less microlenses are formed of dye type colored resists.

16. A solid-state imaging device according to claim 1, wherein the multiplicity of photoelectric conversion units are arranged in a pixel interleaved array.

17. A solid-state imaging device according to claim 1, further comprising a vertical charge transfer channel corresponding to each column of the multiplicity of photoelectric conversion units.

18. A solid-state imaging device according to claim 1, further comprising a MOS-type charge detecting circuit corresponding to each of the multiplicity of photoelectric conversion units.

19. A solid-state imaging device, comprising:
   a semi-conductor substrate demarcating a two-dimensional surface;
   a multiplicity of photoelectric conversion units formed being arranged in a plurality of rows and columns on the semiconductor substrate;
   a planarizing insulating film formed above the semiconductor substrate;
   a plurality of inner-lenses having spectral characters, each inner-lens corresponding to each of the photoelectric conversion units; and
   a plurality of gap-less microlenses made of a transparent resist, each gap-less microlens being formed above each of the photoelectric conversion units with the planarizing insulating film and the inner lenses placed in-between.

20. A manufacturing method of a solid-state imaging device, comprising the steps of:
   (a) preparing a semi-conductor substrate demarcating a two-dimensional surface;
   (b) forming a multiplicity of photoelectric conversion units arranged in a plurality of rows and columns on the semiconductor substrate;
   (c) forming a planarizing insulating film above the semiconductor substrate; and
   (d) forming a plurality of gap-less microlenses having spectral characters, each gap-less microlens being formed above each of the photoelectric conversion units with the planarizing insulating film placed in-between.

21. A manufacturing method of a solid-state imaging device according to claim 20, wherein the step (d) comprising:
   (d1) forming first group of microlenses, each of the first group of microlenses being formed in correspondence to one of the photoelectric conversion units selected from the multiplicity of photoelectric conversion units;
   (d2) forming second group of microlenses, each of the second group of microlenses being formed to partially cover the adjoining first microlenses, in correspondence to one of a first part of the photoelectric conversion units being not selected for the first group of microlenses; and
   (d3) forming third group of microlenses, each of the third group of microlenses being formed to partially cover the adjoining first microlenses, in correspondence to one of a second part of the photoelectric conversion units being not selected for the first group of microlenses.

* * * * *